United States Patent [19]

Sezi et al.

[11] Patent Number: 5,275,920
[45] Date of Patent: Jan. 4, 1994

[54] METHOD OF DRY DEVELOPMENT UTILIZING QUINONE DIAZIDE AND BASIC POLYMER RESIST WITH LATENT IMAGE INTENSIFICATION THROUGH TREATMENT WITH SILICON-ORGANIC COMPOUND IN WATER

[75] Inventors: Recai Sezi, Roettenbach; Rainer Leuschner, Grossenseebach; Michael Sebald, Hessdorf-Hannberg; Siegfried Birkle, Hoechstadt A/Aisch; Hellmut Ahne, Roettenbach, all of Fed. Rep. of Germany

[73] Assignee: Siemens Aktiengesellschaft, Munich, Fed. Rep. of Germany

[21] Appl. No.: 762,071

[22] Filed: Sep. 18, 1991

Related U.S. Application Data

[63] Continuation of Ser. No. 513,865, Apr. 24, 1990, abandoned.

[30] Foreign Application Priority Data

Apr. 24, 1989 [DE] Fed. Rep. of Germany ....... 3913434

[51] Int. Cl.⁵ .............................................. G03F 7/36
[52] U.S. Cl. ..................... 430/315; 430/166; 430/192; 430/313; 430/325; 430/326; 156/628; 156/643; 156/646
[58] Field of Search ............... 430/192, 325, 326, 330, 430/313, 314, 315, 166; 156/628, 643, 646

[56] References Cited

U.S. PATENT DOCUMENTS

| | | | |
|---|---|---|---|
| 4,284,706 | 8/1981 | Clecak | 430/192 |
| 4,339,522 | 7/1982 | Balanson | 430/192 |
| 4,613,398 | 9/1986 | Chiong | 430/314 |
| 4,626,491 | 12/1986 | Gray | 430/191 |
| 4,657,845 | 4/1987 | Frechet | 430/330 |
| 4,737,425 | 4/1988 | Lin et al. | 430/325 |
| 4,782,008 | 11/1988 | Babich | 430/313 |
| 4,835,089 | 5/1989 | Iwayanagi | 430/330 |
| 4,853,315 | 8/1989 | McKean | 430/192 |

FOREIGN PATENT DOCUMENTS 0095209 11/1983 European Pat. Off. .
0136130 4/1985 European Pat. Off. .

OTHER PUBLICATIONS

SPIE Proceedings, vol. 811, pp. 55-61, Apr. 1987 B. Roland et al.

F. Coopmans et al, DESIRE: A New Route to Submicron Optical Lithography, Solid State Technology/-Jun. 1987, 93-99.

Taylor et al, The Role of Inorganic Materials in Dry-Processed Resist Technology, Solid State Technology/Feb. 1984, 145-155.

E. Reichmanis et al, Approaches to Resists for Two-Level RIE Pattern Transfer Applications, Solid State Technology/Aug. 1985, 130-135.

R. F. Leonard et al, Automated In-Line Puddle Development of Positive Photoresists, Solid State Technology/Jun. 1981, 99-102.

*Primary Examiner*—Charles L. Bowers, Jr.
*Assistant Examiner*—Christopher G. Young
*Attorney, Agent, or Firm*—Hill, Steadman & Simpson

[57] ABSTRACT

A finely structurable resist system for a dry development process is provided. A latent image is produced in a light-sensitive layer by imaging exposure and is intensified by treatment with, for example, an organosilicon compound. The etching resistance to an oxygen plasma is simultaneously increased. The light-sensitive layer preferably comprises anhydride or epoxy groups that are suitable for reaction with the functional groups of the organosilicon compounds. A silylizing treatment can be implemented with a solution or emulsion in a simple apparatus or can be implemented in the vapor phase.

2 Claims, 1 Drawing Sheet

METHOD OF DRY DEVELOPMENT UTILIZING QUINONE DIAZIDE AND BASIC POLYMER RESIST WITH LATENT IMAGE INTENSIFICATION THROUGH TREATMENT WITH SILICON-ORGANIC COMPOUND IN WATER

This is a continuation of application Ser. No. 07/513,865, filed Apr. 24,1990, now abandoned.

BACKGROUND OF THE INVENTION

The present invention is directed to finely structurable resist systems for dry development processes. A latent image is produced in a light-sensitive photoresist layer by imaging exposure and the photoresist layer is specifically chemically modified, to increase its etching resistance to a dry etching process, by treatment with an agent. The present invention is also directed to a method for structuring with dry development.

In the micro-electronics industry, photoresists are used to create components, for example, to manufacture semiconductor components. Photoresists are indispensable for producing, for example, integrated circuits or memory modules. The photoresist functions to allow the definition and production of structures in a photolithographic manner. To this end, a prescribed structure is transferred from a mask to a substrate, for example, a wafer, utilizing optical methods.

The transfer of the structure is accomplished with an auxiliary layer of photoresist. The photoresist being designationally chemically modified based on the exposure. Because of the different chemical behaviors of exposed and unexposed regions, it is possible to develop this "picture". This development can be achieved either through a wet-chemical method or a dry method.

Many recent developments in micro-electronics have been accompanied by an increase in the packing density. This has resilted in the requirement that the structures are smaller. The requirement of smaller structures has placed increased demands on the processes for structure generation. Smaller and smaller structures must be generated, as a result thereof higher resolutions and higher contrasts of the photoresist systems used are required.

In order to meet the demands placed on resist systems, due to the miniaturization of microelectronic components, the resist systems, the apparatus, and the methods used must meet new requirements. Not only do the resist systems influence the resultant structures, the properties of the steppers or, of the stepper lens used for the exposure, also have a great influence on the quality of the structure transfer. The wavelength is specifically related to the stepper and lens, this relationship thus limiting the maximum obtainable resolution. According to the equations:

$$CD = k_1 \frac{\lambda}{Na} ; DOF = k_2 \frac{\lambda}{(NA)^2}$$

the smallest resolved structural size (critical dimension CD), as well as, the depth of focus (DOF), are proportional to the wavelength of the light used. CD is also indirectly proportional to the numerical aperture (Na) of the lens used. DOF is also indirectly proportional to the square of the numerical aperture (NA) of the lens used. By reducing the exposure wavelength, further improvements in the structure resolution can thus be achieved.

Wet-developing single-layer resists are known. These, for example, can be composed of a basic polymer and a photoactive component. An example of such a system, includes novolak resins as the basic polymer and quinone azides as the photo-active constituent.

Although these single-layer systems have heretofore satisfied the demands and requirements of photolithography, they do not satisfy the new demands placed on such systems due to the miniaturization of electronic components, for example, structuring with excimer laser steppers in the deep ultraviolet (DUV) range for producing resist structures below 0.5 μm having vertical side walls given high resist thickness. Inadequate resolutions are obtained with known systems given a substrate topography that is increasingly stepped or given highly reflective substrates.

Because the depth of focus becomes smaller given a shorter exposure wavelength and a high numerical aperture for generating extremely small structures, it is extremely difficult given wet-developing single-layer resists to achieve a higher resolution. This is due to the relatively thick resist layers and unavoidable fluctuations in layer thicknesses (over steps on a substrate). These wet-developing single-layer systems are also unsuitable for structuring with DUV light (for example, at 248 nm) due to the high absorption of the light by the novolaks.

In an attempt to alleviate the aforementioned problems of wet-developing single-layer resists, bilayer systems have been developed. These bilayer systems are, however, more complicated. In a bilayer system only an upper thin layer is exposed and structured. The structures produced in such a manner are ultimately transferred into a lower layer(s), the layer that is structured first serves as a contact mask. Depending on the system, a wet development, a dry development ($O_2$/RIE), or a combination of the two methods can be used.

Dry-developing single-layer systems are known and are typically less complex than bilayer systems, but, in part, exhibit the advantages of such systems. In such a system, a latent image is first produced in a resist layer by exposure and is subsequently chemically modified by specific chemical treatment exclusively in the exposed or unexposed regions. Through the chemical treatment an etching resistance is created. For example, an etching resistance to oxygen plasma in dry development, can thus be produced by treatment with an organic metal compound, for example, an organosilicon compound. A "bilayer effect" is achieved in that the chemical modification only proceeds in surface-proximate regions and the structure is transferred onto the regions lying therebelow based on anisotropic development.

U.S. Pat. No. 4,552,833 discloses such a method. A resist layer, composed of t-butoxy carbonyl oxystyrol and a photo-active constituent is exposed in a structuring manner with ultraviolet light. The resist layer is subsequently treated with gaseous hexamethyl disilazane at 85° C. in a vacuum furnace. Because of the silylization of the exposed regions of the resist surface that thereby occurs, high-resolution structures are obtained by subsequent "developing" in an oxygen plasma.

European Patent Application No. EP-A 0 13 61 30, discloses a resolution of 0.5 μm, obtained after exposure of a resist based on acrylate by electron beams, treatment with diborane gas at 40° C., and a subsequent dry development.

EP-A 0184567 and EP-A 0248779 disclose a silylization with hexamethyl disilazane or chlorosilanes.

Similar results are obtained with commercial resists and silicon tetrachloride as a treatment reagent.

All of the above examples of dry-developing single-layer resists, however, have various disadvantages. For example, in all the methods, moisture-sensitive, corrosive or toxic gases or liquids are utilized. Accordingly, special, evacuatable apparatus are required. Moreover, the methods have a long duration. Furthermore, the methods must be performed at an elevated temperature. Still further, process control and reproducibility are critical because of a number of process parameters.

SUMMARY OF THE INVENTION

The present invention provides a dry-developing resist system that allows simple manipulation, can be implemented with existing, standard apparatus, that has a high selectivity in oxygen plasma. The system and method leads to the production of highly resolved structures having steep side walls.

To this end, a finely structurable resist system for a dry development process is provided wherein a latent image is produced in a photoresist layer by imaging exposure and the etching resistance to a dry etching process is increased by chemical treatment with an agent that causes a specific chemical modification. The resist system includes a structurable photoresist and an organic metal compound having at least one reactive group per molecule for treating the photoresist structure. Preferably, the photoresist structure is based on a polymer having reactive groups and photoactive constituents.

In an embodiment, the organic metal compound is present in an aqueous solution, emulsion, or composition including water.

In an embodiment, the photoresist includes a polymer having at least one of the following functional groups: anhydride, epoxy, and enole ether.

In an embodiment, the organic metal compound is an alpha, omega-bifunctional organosilicon compound having 1 to 50 silicon atoms per molecule; in a preferred embodiment, the compound includes 2 to 12 silicon atoms per molecule.

In an embodiment, the organic metal compound is an organosilane that includes at least one hydroxyl or amino group.

In an embodiment, the organic metal compound is an organosiloxane having at least one hydroxyl or carboxyl-amino function.

In an embodiment, the photoresist includes a polymer derived from maleic acid anhydride monomers.

In an embodiment, the photoresist is a copolymer of maleic acid anhydride and styrol.

The present invention also provides a method for producing a resist structure having steep side walls comprising the steps of: producing a photoresist layer on a substrate; the photoresist layer is exposed whereby a photochemical reaction is triggered in the exposed regions and a latent image is thus produced in the photoresist layer; the latent image is intensified by specific chemical treatment with an agent; an organic metal compound comprising at least one hydroxyl or amino group is used for treatment, either in the liquid or vapor phase; and the photoresist layer treated in this manner is anisotropically etched in an oxygen-containing plasma, the treated regions having an increased etching resistance and remain as raised structures having steep etched side walls.

In an embodiment of the method, the treatment is implemented in a standard spray, puddle, or immersion developer, the agent being present in an aqueous solution, emulsion, or composition containing water.

In an embodiment of the method, an organosilicon compound is used as the agent.

In an embodiment of the method, a diaminosiloxane having 1 to 50, preferably having 2 to 12, silicon atoms, is used as the agent.

In an embodiment of the method, the duration of the treatment is approximately 10 seconds to about 5 minutes.

In an embodiment of the method, a mixture of a basic polymer and of a photo-active constituent (PAC) is used as the photoresist layer. In an embodiment, the polymer used comprises anhydride functions.

In an embodiment of the method, the photoresist layer is generated as a top resist above a dry-etching planarization layer.

In an embodiment of the method, the photo-active constituent is derived from a structure having the general structure formulas P, Q, and R:

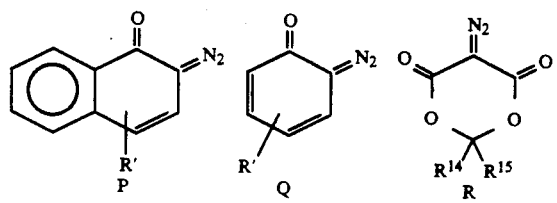

wherein:

R' is —SO$_3$R or —CO$_2$R;

R$^{15}$ and R$^{14}$ are an arbitrary organic radials; and

R is an alkyl, aryl, halogenalkyl, halogenaryl, or halogen.

In an embodiment of the method, the exposed photoresist layer is initially heated before the chemical treatment in order to deactivate the activated regions by chemical reaction; and flood lighting is subsequently performed for producing an activation of those regions not exposed in the first step.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
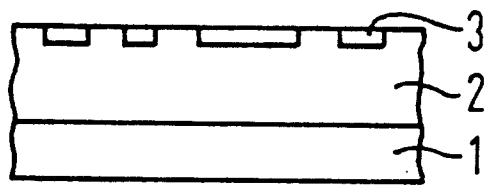
FIG. 1 illustrates a structure after a step of the method of the present invention.

The present invention provides an improved dry-developing resist system and method for producing resist structures.

The resist system of the present invention comprises: a structurable photoresist, particularly based on a basic polymer with reactive groups and a photo-active constituent; and an organic metal compound having at least one reactive group per molecule for treating the photoresist structure.

The present invention provides an easily manipulated system and method that is composed of only two constituents and requires only one further process step compared to a typical single-layer resist used for lithography methods. The photoresist system can be used in varied applications because it is adaptable to a variety of parameters.

The photoresist systems allows the sensitivity with respect to intensity and wavelength of the radiation used for the exposure to be optimized independent of further parameters. Etching resistance and thermomechanical properties of the resist system, or of a photoresist structure produced therefrom, can be induced by treatment with the agent of the system.

Only the functional groups of the photoresist and the agent are not-selectable independent of one another. This is due to the fact that a chemical compound must form between the two constituents. The organic metal compound bonded to the resist layer, by a specific reaction, produces an increased etching resistance of the photoresist to oxygen plasma. Because this reaction specifically occurs in exposed or, respectively, unexposed regions of the photoresist layer, the image, that was heretofore only latent after the exposure, is chemically modified and is thereby provided better contrast. Structures having high-contrast and high-resolution are provided and steep side walls can therefore be produced in the development process, an anisotropic etching process in an oxygen plasma.

The photoresist of the present invention can include a basic polymer and a photo-active constituent. The basic polymer can comprise, as a functional group, an anhydride or epoxy group. Such a photoresist provides good storage characteristics under normal conditions. However, due to the functional groups, the photoresist nonetheless enables a chemical reaction with a plurality of different reagents.

By utilizing suitable photo-active constituents, the photoresist can be exposed in the deep ultraviolet range (DUV) and thus, structured. This is due to the fact that the basic polymers, having the above recited functional groups, have a high transparency for radiation in the DUV range. Quinone diazides, for example, provide good bleaching, photo-active constituents.

In a preferred embodiment, the organic metal constituent is an alpha, omega, bi-functional, organosilicon compound having 1 to 50 silicon atoms per molecule; preferably, 2 to 12 silicon atoms per molecule. A reliable bonding of the organosilicon compound to specific regions of the photoresist layer is ensured based on two or even more functional groups per molecule of the organic metal constituent. The more silicon atoms in the organic metal constituent, the quicker the increase in etching resistance of the treated photoresist layer. The more non-volatile silicon dioxide that can be formed in the oxygen plasma, the more silicon that is contained in the resist layer.

It may be desirable to limit the maximum molecule size of the organosilicon compound. For example, in one embodiment of the present invention, an adequate solubility in water, or in a medium that at least contains water, is required. Additionally, if the molecules are excessively large a diffusion of the organic metal constituent into the photoresist layer could be impeded. In order to generate adequately thick, etch-resistant layers, a good diffusion of the organosilicon compound into the resist layer is necessary.

By way of example, the silylization agent can be an organosilane that comprises at least one hydroxyl, amino, or carboxyl group as a functional group. Silanes are desirable since they are stable in water and can be stored for a longer period of time in solution. Hydroxyl, amino, and carboxyl reactive groups bond well to the functional groups of the basic polymer and simultaneously produce a good solubility in an aqueous medium.

When the organic metal constituent includes organosiloxane reactive groups, further advantages are achieved. Si-0 bonds that have been created therein provide an easier and faster production of silicon dioxide in the oxygen plasma. This reduces the probability of volatile organosilicon compounds being generated.

It has also been observed that good results are achieved with a photoresist that includes anhydride groups in the basic polymer. The anhydride group can be cyclic or linear, and can be contained in the main chain or in a side chain of the basic polymer. Such polymers have a high DUV transparency ($\alpha_{248}$ about 0.1 $\mu m^{-1}$) because the anhydride group does not have an increased absorption for DUV and has a high softening temperature of above 160° C.

A high softening temperature is of particular significance for plasma-etching processes that involve higher temperatures. The high softening temperature prevents the generated structures from flowing during the etching process.

A high contrast can be achieved with the photoresist of the present invention given photo-active constituents such as, for example, quinone diazides. The regions of the photoresist layer that have become hydrophilic, due to the exposure, promote a diffusion of the silylization agent into the photoresist layer where they are chemically bonded. At least one amino function at the silylization agent is necessary in this case since the "hydrolysis" of the anhydride group otherwise proceeds too slowly. According to the equation

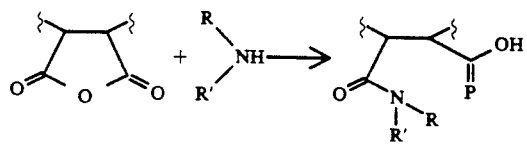

amino carbonic acids are formed that are now in turn capable of reacting with other functional groups. In an embodiment, diamino-organo silicon compounds are preferably utilized in this case; however, amino alcohol silicon compounds, for example, can also be used.

As the basic polymer, the photoresist can comprise a homopolymer or copolymer that is derived from 1 through 100 percent from monomers carrying anhydride functions. It has been found that a basic polymer that is derived from 10 through 55 mol percent maleic acid anhydride monomers functions satisfactorily. Monomers, for the photoresist, can be selected from copolymers such that, for example, the etching resistance to a halogen-containing plasma is intensified. This is particularly achieved with aromatic compounds. Such further monomers, for example, can have the structural formulas A, B, C, or D set forth below:

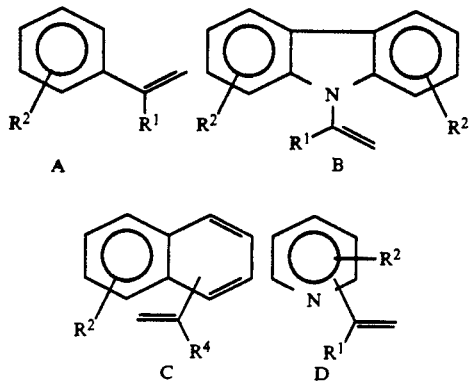

wherein:

$R^1$ and $R^2$ are H, alkyl, aryl, or a halogen independent of one another.

In an embodiment, the photoresist of the invention can comprise, for example, a basic polymer having the general structural formula E:

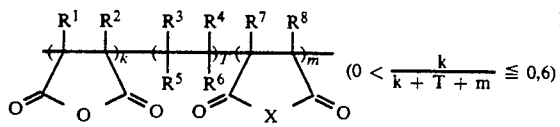

wherein:

the structure unit having an index k comprises 10 through 60 percent of the structural units;

k, r, and m are whole numbers and r or m can be 0;

$R^3$ through $R^8$ are hydrogen, alkyl, aryl, halogen, halogen-substituted alkyl or, respectively, aryl or an olefinically unsaturated radical;

additionally, $R^5$ is also methoxyphenyl,

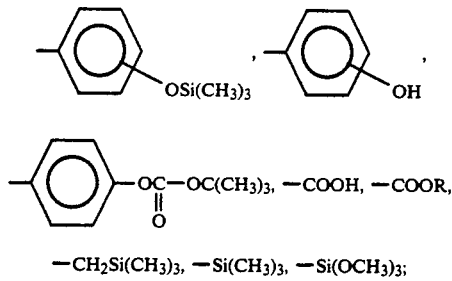

$-CH_2Si(CH_3)_3$, $-Si(CH_3)_3$, $-Si(OCH_3)_3$;

X is O, NR, or S; and

R is H, alkyl, aryl, vinyl, allyl, or acrylic.

As regularly recurring units, the basic polymer can also comprise units in the chain that have the structural formulas F, G, H, or I, wherein $R^3$ and $R^4$ stand for the above-recited groups. Further, the basic polymer can be derived from anhydride monomers that have at least one of the structures K or L:

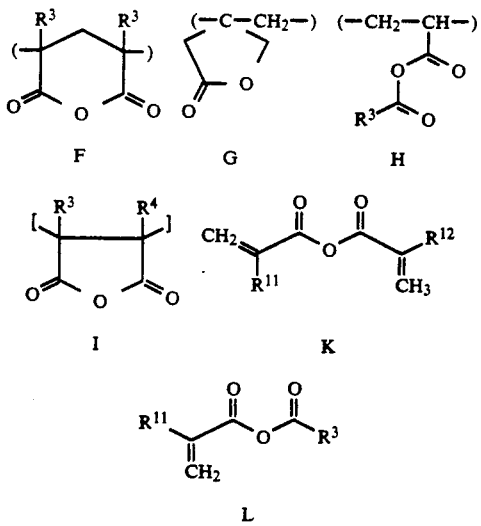

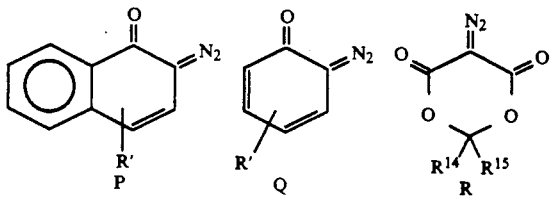

wherein: $R^{11}$ and $R^{12}$ are H or alkyl.

Photo-active constituents that are well-suited for the system include those compounds having the structural formulas P, Q, or R, or that are derived from one of these structures:

wherein:

$R^{14}$ and $R^{15}$ are an arbitrary organic radical independent of one another;

$R'$ is $-SO_3R$ or $-CO_2R$; and

R is alkyl, aryl, halogen alkyl, halogen aryl, halogen, or alkoxyaryl.

The photo-active constituent thereby has its radicals R adapted to the basic polymer. A photo-active constituent that is well-suited for an anhydride-containing photoresist is a 4-sulfonic acid ester of naphthoquinone diazide and multivalent phenols such as, for example, bisphenol A.

The present invention also provides a method of producing a resist structure with the assistance of the resist system of the invention. To this end, a photoresist layer is first produced on a substrate whose surface is composed of semiconductor material, metal, ceramic, or other arbitrary materials to be structured. The photoresist layer is exposed with respect to the image utilizing a mask, whereby a latent image is produced by a photochemical reaction in the exposed regions of the photoresist layer.

This latent image is intensified by specific treatment, for example a silylization. To that end, an organic metal compound comprising at least one hydroxyl or amino group is used in an aqueous solution, emulsion, or composition that contains water. The hydrolysis-stability and reactivity of the organic metal constituent that is present allows the treatment to proceed at ambient temperature and atmospheric pressure. Of course, if desired, the reaction can be accelerated by elevating the temperature. The photoresist layer treated in this manner is ultimately anisotropically etched in an oxygen-containing plasma. The regions that, for example, are silylized have an increased etching resistance and protect the layer regions lying therebelow against erosion in oxygen plasma. Due to the high etching resistance of the photoresist layer, specifically silylized in the exposed regions, and due to the anisotropy of the etching process, the produced structures have steep side walls.

The method of the present invention is simple to implement, and the treatment with the silylization agent can be performed in simple apparatus that are standard in the semiconductor industry. For example, spray, puddle, or immersion developers can be used for this purpose.

Due to the bonding of the organo silicon compound in the exposed regions of the previously planar photoresist layer, an increase in the volume of the resist layer is produced in these regions. The increase in volume can be optically measured in the form of elevations of the photoresist layer. The reaction time for an adequate to complete silylization of the photoresist layer in the exposed regions is approximately 10 seconds to about 5 minutes. By varying the reaction time or shortening the treatment duration, the extent of the silylization and of the volume increase caused as a result thereof can be controlled. The importance of controlling the volume increase is more important the smaller the structures to be generated. For example, a structure in the 0.5 μm range requires extreme precision in the generation of its structure; for example, structures prescribed on the mask must be exactly transferred. Any method-induced modification must be avoided or compensated for. The method of the present invention therefore provides a precise monitoring of the lateral structure spread caused by the increase in volume of the photoresist during treatment.

The silylization reaction can be controlled based on the concentration of the silylization agent, by controlling the temperature and/or duration of the process. A longer treatment duration, higher concentration, or higher temperature will result in greater yield of the silylization produced and a greater volume increase that yields a broadening of the raised photoresist structures. This results in a diminishing of the diameter of resist trenches respective to resist ridges.

Although, in an embodiment, the chemical treatment is performed in the liquid phase it can also be performed in the vapor phase. Photoresists that contain anhydride can thus be treated with amino silanes and amino siloxanes, assuming they have an appropriate volatility. The agent can be siloxanes since they convert faster and more completely into non-volatile $SiO_2$ on the resist when etched in an oxygen plasma. The vapor phase reaction, however, produces flatter silylization profiles than treatment with an agent in the liquid phase. Therefore, a result of treatment in the vapor phase is that there is less process reliability in the etching step with respect to the dimensional accuracy of the structure transfer.

By way of example, and not limitation, examples of the resist system of the present invention and the use of same in the method of the present invention shall be set forth in greater detail with reference to six examples and the figures.

The reagents that were used in the examples were as follows:

1. A copolymer of styrol and maleic acid anhydride having a molecular weight ($M_n$) of 2400 was produced by radical polymerization of the two monomers with azoisobutyric acid dinitrile as an initiator and n butylmercaptane as a regulator.
2. A copolymer of styrol and maleic acid anhydride having a molecular weight ($M_n$) of 6700 was produced as in 1 above but without the use of a regulator.
3. A diester of bisphenol A with naphthaquinonediazide-4-sulfonic acid was used as a photo-active constituent (PAC).
4. A silylization solution was created comprising 25 weight parts ("GT") diaminosiloxane, 50 GT isopropyl alcohol, and 25 GT water. An alpha, omega-aminofunctional siloxane, having two terminal aminopropyl groups and 10 to 12 silicon atoms in the chain was used.
5. A further silylization solution was created composed of 8 GT oligomeric diaminosiloxane, 79 GT isopropyl alcohol, 12.8 GT water, and 0.2 GT ammonia.
6. A third silylization solution was created composed of 2 GT bis-(3-aminopropyl)-tetramethyldisiloxane, 1 GT emulsifier (for example, pril), and 97 GT water.

FIRST EXAMPLE

A resist solution was created composed of 13.2 GT basic polymer (2) (the numbers herein refer to the reagents set forth above), 8.8 GT PAC (3), and a solvent 78 GT 2-Methoxy-1-propylacetate (MPA) was spun onto a silicon wafer. A resist layer having a thickness of 1200 nm arose after drying at 110° C. on a hot plate. This was now contact-exposed with 50 mJ/cm² with light of 257 nm through a mask having small structures down to 0.5 μm. Following thereupon, treatment with a silylization solution (4) was performed for 60 seconds. The structure was then rinsed with isopropanol. Dry development was then implemented in a plasma reactor in oxygen plasma ($O_2$/RIE, 6 m Torr gas pressure and 410 volt bias voltage).

Structures that were 0.5 μm wide and having vertical side walls were obtained. The ratio of ridge to trench was 1:1. This ratio can be intentionally increased in favor of the ridges by lengthening the silylization time.

FIG. 1 illustrates a substrate 1 covered with a photoresist layer 2 after the contact exposure. The exposed regions 3 of the photoresist layer 2 are chemically modified by the exposure.

Figure 2:
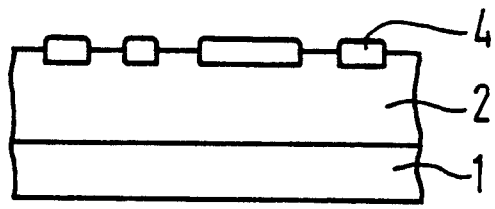
FIG. 2 illustrates a structure after a further step of the method of the present invention.

FIG. 2 illustrates the arrangement after treatment with the silylization solution. By specific reaction of this solution with the photoresist in the exposed regions 3, the regions 4 treated in this manner have increased in volume due to a chemical bonding of the organosilicon compound. The image that is initially only latent due to the exposure can now also be "optically" measured since the treated regions 4 are elevated over the unexposed regions of the photoresist layer 2.

Figure 3:
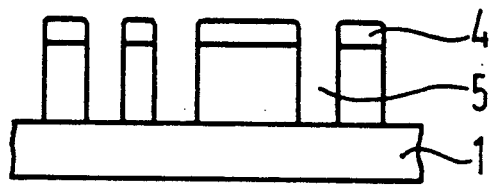
FIG. 3 illustrates a structure after a further step of the method of the present invention.
Figure 4:
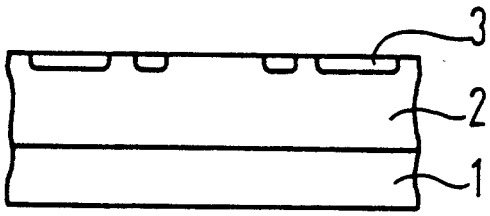
FIG. 4 illustrates a structure after a step of the method of the present invention.

FIG. 3 illustrates the arrangement after the plasma etching step. Vertical trenches 5 that extend down to the substrate 1 arise in the photoresist layer 2 based on anisotropic etching. The treated regions 4 act as a contact mask in the plasma etching step and protect the regions of the photoresist layer 2 lying therebelow against erosion due to the oxygen plasma.

SECOND EXAMPLE

A commercially available photoresist AZ 1450 J was spun onto a silicon wafer and was subsequently annealed in two temperature steps up to and including 210° C. After this step, the layer thickness of the resist that serves as a planarization layer was 1.8 μm. A resist comprising 12 GT basic polymer (1), 8 GT PAC (2), and 80 GT MPA was spun onto this. After drying at 110° C., the layer thickness of the resist layer, functioning as the top resist, amounted to 0.5 μm. Contact exposure was now performed with 90 mJ/cm² at 257 nm and treatment with the silylization solution was subsequently performed for approximately 3 to about 5 seconds. A rinsing with isopropyl alcohol followed.

Similar to Example 1, silylization only occurred in the exposed regions of the photoresist layer (see FIGS. 1 and 2). After a following reactive ion etching (at 500 V and 6 mtorr), structures having vertical side walls and structure widths down to 0.5 μm were obtained that correspond to the smallest structures prescribed on the mask. The treated regions 4 function as a contact mask during etching and prevent any erosion of the regions of the photoresist layer 2 lying therebelow and of the corresponding regions of the bottom resist (now shown in the Figure).

THIRD EXAMPLE

A resist solution composed of 13 GT basic polymer (1), 7 GT PAC (3), and 80 GT cyclohexanone (as a solvent) was spun onto a silicon wafer and was dried at 110°. A resist having a layer thickness of 1.4 μm was obtained. This was contact-exposed through a mask with 40 mJ/cm² at 363 nm, was subsequently treated for 10 seconds with the silylization solution (5), and was subsequently rinsed with isopropanol. Etching ensued in a plasma reactor (O₂/RIE, 6 mtorr gas pressure and 410 V bias voltage) Structures having a structure width down to 0.5 μm and having vertical side walls were obtained (see FIG. 3).

FOURTH EXAMPLE

The resist was applied and exposed as in Example 3. Subsequently, it was treated for 60 seconds with the silylization solution (6) and was subsequently rinsed with isopropanol. After dry-etching (as in Example 3), well-resolved structures having vertical side walls were again obtained.

FIFTH EXAMPLE

A resist solution composed of 18 GT of an epoxy novolak, 2 GT PAC (3), 0.02 through 0.04 GT of a photo-active, strong acid forming agent (for example, Digacure KI 85), and 80 GT cyclohexanone was applied onto a wafer so that a layer thickness of 1.4 μm was obtained after drying at 90° C. Contact exposure was performed through a mask with 30 mJ/cm² at 249 nm. This was followed by a 60-second treatment with the silylization solution (4). After rinsing with isopropanol, dry developing was performed in the plasma reactor (O₂/RIE, 6 mtorr gas pressure and 410 V bias voltage). Negative structures (corresponding to the treated regions 4 in FIG. 3) having vertical side walls were obtained. If desired, the silylization reaction can be accelerated using a suitable catalyst.

SIXTH EXAMPLE

In an embodiment of the present invention, it is possible to obtain a positive image or, respectively, positive structures, on the basis of two further, simple method steps with the same exposure.

Figure 5:
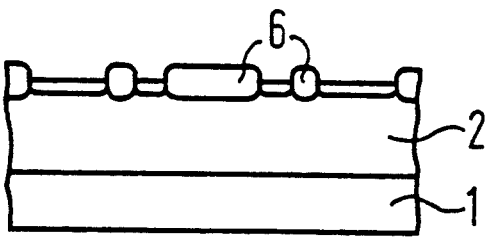
FIG. 5 illustrates a structure after a further step of the method of the present invention.

To this end, the resist layer produced in Example 5 was heated through the mask to 80° through 90° C. for 120 seconds after contact exposure. In this heating step, all of the reactive groups completely react in the exposed regions 3 with catalysis of the acid that arise due to the exposure. The resist was then flood lighted (without mask) at 30 mJ/cm² and was treated with the silylization solution (4) for 60 seconds. Only those regions 6 (see FIG. 5) that remain unexposed in the first exposure are silylized that is performed through the mask and were only chemically activated by the second flood lighting. After rinsing with isopropanol, dry etching was carried out as in Example 5.

Figure 6:
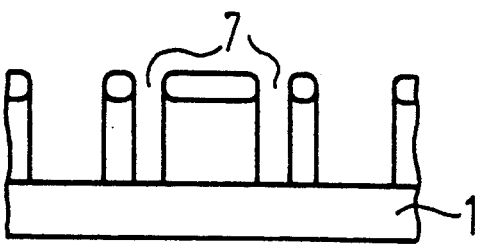
FIG. 6 illustrates a structure after a further step of the method of the present invention.

FIG. 6 illustrates the arrangement after this step in which the elevated structures defined by the regions 6 correspond to a positive image of the first exposure step (through the mask). With a few simple steps, this method thus allows an image inversion of the structures prescribed on the mask to be produced.

Generally, the method of the present invention can be distinguished by its simple process management at ambient conditions, i.e., temperature and atmosphere, and short processing time. The processes can be completely integrated into existing systems and thereby does not require new capital costs to implement. The treated regions exhibit high etching resistance that allow a dimensionally accurate structure transfer.

Comparative tests have determined that a noticeably higher resistance to oxygen etching is produced by treatment with the siloxanes of the present invention than with comparable silylethers of phenolic substances known from the literature that arise in the implementation of comparable, known processes. Further, the treated resist regions are inventively chemically cross-linked with a multi-functional agent, they thereby become more dimensionally stable. A double process reliability is thus achieved in that treatment is preferably carried out at room temperature and the softening temperature of the resist structures is simultaneously increased by cross-linking. A flowing of the photoresist structures at elevated temperatures is thus prevented.

As illustrated by the examples, the method of the present invention can be used not only for single-layer systems, but can also be utilized for dry-developing bilayer systems. The reactive resist is then located as a thin layer on a planarization layer that is freely selectable according to requirements. Dependent on the selection of the photo-active constituent that must absorb and react in the range of the exposure wavelengths, the resist can be exposed, for example, at 248, 313, 365, or at 436 nm.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for producing a resist structure having steep side walls comprising the steps of:
   producing a photoresist layer including a basic polymeric and a photoactive constituent on a substrate, the photoresist layer being generated as the top resist above a dry-etchable planarization layer, wherein the basic polymeric contains reactive groups selected from the group consisting of epoxy and anhydride groups, and wherein the photoactive constituent is quinone diazide;

imagewise exposing the photoresist layer wherein a photochemical reaction is triggered in the exposed regions and a latent image is thus produced in the photoresist layer;

intensifying the latent image by chemical treatment of the entire surface of the photoresist layer with an agent for a duration of approximately 10 seconds to about 5 minutes, causing a specific reaction of the exposed regions of the photoresist layer with the agent, wherein the agent for treating is present in water and is a silicon-organic compound comprising at least one hydrolysis-stable hydroxyl or amino group and is selected from the group consisting of an alpha, omega-bifunctional organosilicon compound having 1 to 50 silicon atoms per molecule and diaminosiloxane having 1 to 50 silicon atoms, and wherein said reaction is carried out in a standard developer apparatus, said reaction caused by a chemical reaction between said silicon-organic compound and said reaction groups of said basic polymer; and anisotropically etching the treated photoresist layer in an oxygen-containing plasma etching system that is a different system from the standard developer apparatus, wherein the exposed regions, having reacted with said agent, have an increased etching resistance and remain as raised structures having steep etched side walls.

2. A method for producing a resist structure having steep side walls comprising the steps of:

producing a photoresist layer comprising a basic polymer and a photoactive constituent on a substrate, the photoresist layer being generated as the top resist above a dry-etchable planarization layer, and wherein the basic polymer contains reactive groups selected from the group consisting of epoxy and anhydride groups and the photoactive constituent is selected from the group of compounds having the following structural formulas:

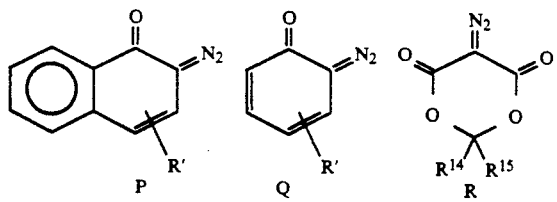

wherein:

R' is —SO$_3$R or —CO$_2$R;

R$^{15}$ and R$^{14}$ are arbitrary organic radicals; and

R is alkyl, aryl, halogenalkyl, halogenaryl, or a halogen;

imagewise exposing the photoresist layer wherein a photochemical reaction is triggered in the exposed regions and a latent image is thus produced in the photoresist layer;

intensifying the latent image by chemical treatment of the entire surface of the photoresist layer with an agent for a duration of approximately 10 seconds to about 5 minutes, causing a specific reaction of the exposed regions of the photoresist layer with the agent, wherein the agent for treating is present in water and is a silicon-organic compound comprising at least one hydroxyl or amino group and is selected from the group consisting of an alpha, omega-bifunctional organosilicon compound having 1 to 50 silicon atoms per molecule and diaminosiloxane having 1 to 50 silicon atoms, and wherein said reaction is carried out in a standard developer apparatus; and anisotropically etching the treated photoresist layer in an oxygen-containing plasma etching system that is a different system from the standard developer apparatus, wherein the exposed regions, having reacted with said agent, have an increased etching resistance and remain as raised structures having steep etched side walls.

* * * * *